United States Patent
Chen et al.

(10) Patent No.: US 8,570,823 B2
(45) Date of Patent: Oct. 29, 2013

(54) SENSE AMPLIFIER WITH LOW SENSING MARGIN AND HIGH DEVICE VARIATION TOLERANCE

(75) Inventors: Yen-Huei Chen, Hsinchu (TW); Hsien-Yu Pan, Hsinchu (TW); Shao-Yu Chou, Chu Pei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 354 days.

(21) Appl. No.: 12/708,108

(22) Filed: Feb. 18, 2010

(65) Prior Publication Data

US 2011/0199847 A1    Aug. 18, 2011

(51) Int. Cl.
*G11C 7/00* (2006.01)

(52) U.S. Cl.
USPC ............... 365/205; 365/189.05; 365/185.04; 365/230.08

(58) Field of Classification Search
USPC .................. 365/205, 189.05, 185.04, 230.08
See application file for complete search history.

(56) References Cited

U.S. PATENT DOCUMENTS

| | | | | |
|---|---|---|---|---|
| 6,038,186 A * | 3/2000 | Tanizaki | | 365/222 |
| 6,349,054 B1 * | 2/2002 | Hidaka | | 365/173 |
| 6,728,122 B2 * | 4/2004 | Tanizaki et al. | | 365/3 |
| 7,263,016 B1 * | 8/2007 | Palumbo et al. | | 365/205 |
| 7,545,180 B2 * | 6/2009 | Goel et al. | | 327/57 |
| 7,710,812 B2 * | 5/2010 | Fukuda | | 365/222 |
| 7,728,644 B2 * | 6/2010 | Seo et al. | | 327/291 |
| 7,826,298 B2 * | 11/2010 | Nakai et al. | | 365/229 |
| 2009/0016134 A1 | 1/2009 | Fukuda | | |

OTHER PUBLICATIONS

Dhong, Sang H., et al., "A 4.8GHz Fully Pipelined Embedded SRAM in the Streaming Processor of a CELL Processor", ISSCC 2005, Session 26, Static Memory, 26.7 2005 IEEE International Solid-State Circuits Conference; pp. 486-487 and 612.

Office Action dated Dec. 31, 2012 from corresponding application No. CN 201010197245.X.

* cited by examiner

*Primary Examiner* — Connie Yoha
(74) *Attorney, Agent, or Firm* — Lowe Hauptman & Ham, LLP (57) ABSTRACT

In an embodiment related to a sense amplifier, the sense amplifier includes a pair of transistors (e.g., transistors P2 and P3) that, when appropriate, enables data on input lines DL and DLB to be preset directly to the internal nodes (e.g., nodes S and SB) of the sense amplifier, from which the data can be read out. In addition, this pair of transistors P2 and P3 also allows the internal nodes S and SB to share the pre-charge mechanisms of lines DL and DLB.

22 Claims, 7 Drawing Sheets

SENSE AMPLIFIER WITH LOW SENSING MARGIN AND HIGH DEVICE VARIATION TOLERANCE

TECHNICAL FIELD

The present invention is generally related to sense amplifiers (SAs). In various embodiments, the sense amplifier operates with a low sensing margin and handles a high device variation tolerance.

BACKGROUND

Sense amplifiers have served as an important component for SRAM design, which normally requires low sensing margins and fast response times. Sensing margin is the lowest voltage difference between two data lines (e.g., a bit-line BL and a bit-line BLB) that can be discriminated by a sense amplifier. The lower sensing margin at which a sense amplifier can operate the better the sense amplifier is. In advanced technologies (e.g., 40 nm, 28 nm and below), device (e.g., transistor) scaling has caused huge device mismatches and thus increased the challenge to acquire lower sensing margin for SAs. Device variations commonly refer to the change in the threshold voltage of a device with respect to layout areas. Various approaches, to improve sensing margin, increase device size to lower device variations because the sigma of threshold voltage of the device is inversely proportional to the channel width and length of the device. Enlarging the device size, however, significantly increases the die areas, which is generally unwanted.

BRIEF DESCRIPTION OF THE DRAWINGS

The details of one or more embodiments of the invention are set forth in the accompanying drawings and the description below. Other features and advantages of the invention will be apparent from the description, drawings, and claims.

Like reference symbols in the various drawings indicate like elements.

DETAILED DESCRIPTION

Embodiments, or examples, of the invention illustrated in the drawings are now being described using specific language. It will nevertheless be understood that no limitation of the scope of the invention is thereby intended. Any alterations and modifications in the described embodiments, and any further applications of principles of the invention described in this document are contemplated as would normally occur to one skilled in the art to which the invention relates. Reference numbers may be repeated throughout the embodiments, but this does not necessarily require that feature(s) of one embodiment apply to another embodiment, even if they share the same reference number.

Circuit Embodiments

Figure 1A:
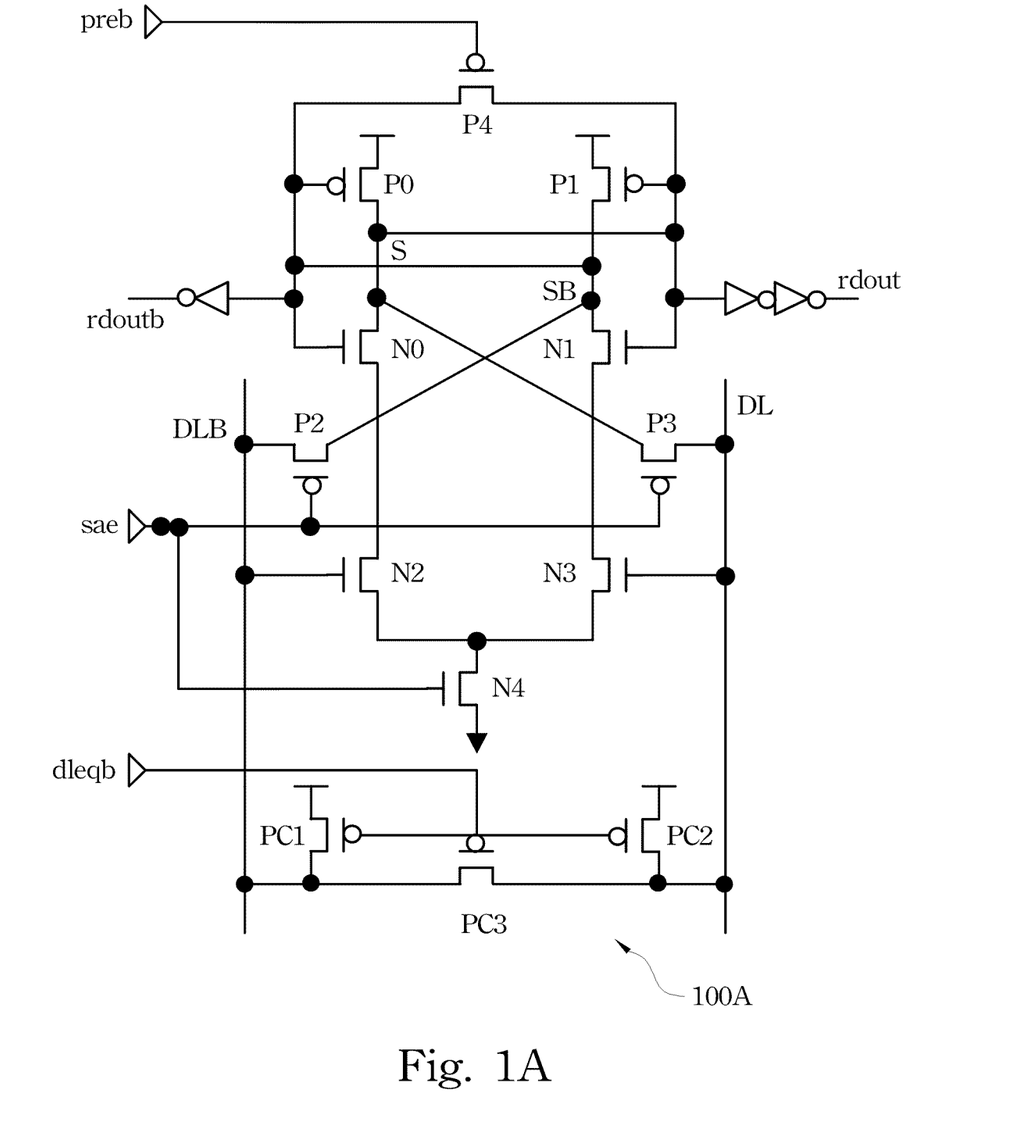
FIG. 1A shows a sense amplifier in accordance with a first embodiment of the invention.

FIG. 1A shows a sense amplifier (SA) 100A upon which embodiments of the invention may be implemented. In an embodiment, supply voltage Vdd for SA 100A is configured at 0.8V.

Signal preb controls transistor P4 to equalize nodes S and SB. When signal preb is activated (e.g., low), it turns on transistor P4 making it a virtual short and, thus enabling the voltage at its drain and source, or at nodes S and SB, to be equal. Signal preb and transistor P4 may be referred to as an equalizing signal and transistor, respectively, because they equalize data (e.g., the voltage level) at nodes S and SB. Because nodes S and SB are coupled to the gate of transistors P1 and P0, when nodes S and SB are charged (e.g., high), they turn off transistors P1 and P0, respectively.

Transistors P0, P1, N0, and N1 form a cross latch for SA 100A, e.g., cross latch CX (not labeled). Nodes S and SB are commonly referred to as the internal nodes of cross latch CX, and store data for SA 100 from which this data can be read out through node rdout and/or rdoutb. In various embodiments, if node S is pulled lower than node SB, the read out data at node rdout is low. In contrast, if node S is higher than node SB, the read out data is high.

Lines DL and DLB serve to receive input data (e.g., from a memory cell). The data on these two lines DL and DLB when appropriate is directly passed (e.g., preset) to nodes S and SB via transistor P3 and P2 respectively. Because the data is read from nodes S and SB to node rdout and/or node rdoutb, and the data, when appropriate, is preset directly to these nodes S and SB, some embodiments improve read speed as compared to other approaches that do not transfer data directly to nodes S and SB. Data on lines DL and DLB also control transistors N3 and N2, respectively. When SA 100A is used with a memory, in a read operation, the data in a bit cell being read discharges the data on line DL or DLB, making the level of one line lower than the level of the other line.

Transistors P2 and P3 are configured to have their drains connected to the drains of transistors N1 and N0 (or the source of transistors P1 and P0), and as a result enable the direct transfer of data on lines DLB and DL to nodes SB and S respectively. This configuration of transistors P2 and P3 also enables internal nodes S and SB to share the pre-charge circuit of lines DL and DLB (e.g., transistors PC1, PC2 and PC3). Transistors P2 and P3 are used for illustration only, other devices and or techniques (e.g., FIG. 1B) that can directly transfer data from lines DL and DLB to nodes S and SB are within the scope of embodiments of the invention.

Transistors N2 and N3 serve as the common mode input for SA 100A. Transistor N4 provides a current path for cross latch CX, e.g., for transistors P0, N0, P1, and N1, and also for transistors N2 and N3. When transistor N4 is on, a first discharge path, e.g., discharge path DC1 comprising transistors N0, N2, and N4, or a second discharge path, e.g., discharge path DC2 comprising transistors N1, N3, and N4 may be formed.

Signal sae controls transistor N4 and thus cross latch CX. When signal sae is activated (e.g., high), it turns on transistor N4, and as a result provides a current path for cross latch CX. Signal sae also controls transistors P2 and P3, which in turn controls the (pre-)charge for nodes S and SB. In effect, signal sae and transistors P2 and P3 enable nodes S and SB to share the pre-charge circuitry comprising signal dleqb and transistors PC1, PC2, and PC3 for lines DL and DLB. For example, once lines DL and DLB are pre-charged (e.g., high), embodiments of the invention deactivate signal sae to turn on transistors P2 and P3, which transfers the high level of lines DLB and DL to nodes SB and S through transistors P2 and P3, respectively. Generally, when signal sae is deactivated (e.g., low), the sensing function for SA 100A is not used because cross latch CX is off (e.g., there is no current path through transistor N4), embodiments of the invention take advantage of this time to pre-charge nodes S and SB. The term pre-charge refers to charging before reading/sensing data for SA 100A. Embodiments of the invention are advantageous over other approaches because nodes S and SB share the pre-charge mechanism with lines DL and DLB whereas in other approaches there would be a dedicated pre-charge mechanism for nodes S and SB.

Signal dleqb controls transistors PC1, PC2, and PC3, to provide a pre-charge and equalizing mechanism for lines DL and DLB. When signal dleqb is activated (e.g., low), it turns on transistors PC1, PC2, and PC3 allowing lines DL and DLB to have the voltage level Vdd of transistors PC1 and PC2. Expressed alternatively, signal dleqb and transistors PC1 and PC2 pre-charge lines DL and DLB. Transistor PC3 equalizes lines DL and DLB. As discussed above, embodiments also use the pre-charge mechanism of lines DL and DLB, signal sae, and transistors P2 and P3 to pre-charge nodes S and SB.

In ideal situations, transistors N0 and N2 are equal to transistors N1 and N3 (e.g., are of the same type, same size, same driving capabilities, etc.) so that sensing data by SA 100A depends mainly on data DL and DLB. In reality, there are mismatches between these transistors (e.g., one transistor is stronger with a better driving capability than the other transistor), which can affect the operation of SA 100A. For example, if transistor N0 and/or N2 is stronger than transistor N1 and/or N3, the first discharge path (e.g., discharge path DC1) comprising transistors N0, N2, and N4 is faster than the second discharge path (e.g., discharge path DC2) comprising transistors N1, N3, and N4, and vice versa. This mismatch and difference in discharge paths DC1 and DC2 can significantly degrade device performance because the mismatch can increase the sensing margin of SA 100A. Embodiments of the invention, however, when appropriate, preset the data directly to nodes S and SB or the drain of transistors N0 and N1, instead of the source of transistors N0 and N1. In effect, embodiments bypass transistors N0 and N1, and as a result can mitigate the effect caused by the mismatch between transistors N0 and N1, which are advantageous over other approaches where the data is transferred to the source of transistors N0 and N1, and is subject to the mismatch between these two transistors N0 and N1.

Figure 1B:
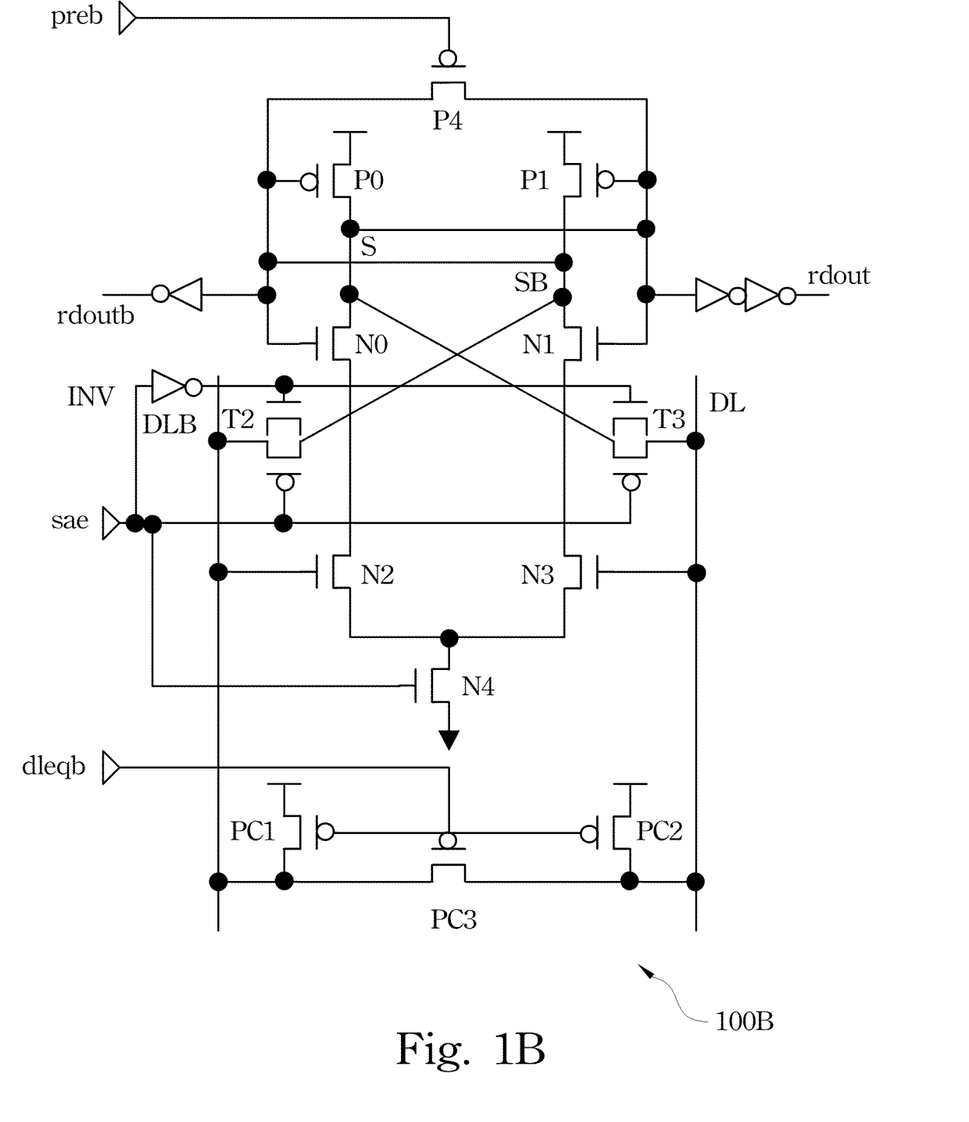
FIG. 1B shows a sense amplifier in accordance with a second embodiment of the invention.

FIG. 1B shows a SA 100B in accordance with another embodiment of the invention. As compared to SA 100A, SA 100B includes pass gates T2 and T3 and inverter INV that replace transistors P2 and P3. Inverter INV inverts signal sae to provide a signal (e.g., signal saeb, not shown), which, together with signal sae controls pass gates T2 and T3. Similarly to transistors P2 and P3, pass gates T2 and T3 transfer data on lines DL and DLB to nodes S and SB as appropriate, consistent with the spirit and scope of embodiments of the invention as described herein.

Flowchart Illustrating a Method Embodiment

Figure 2A:
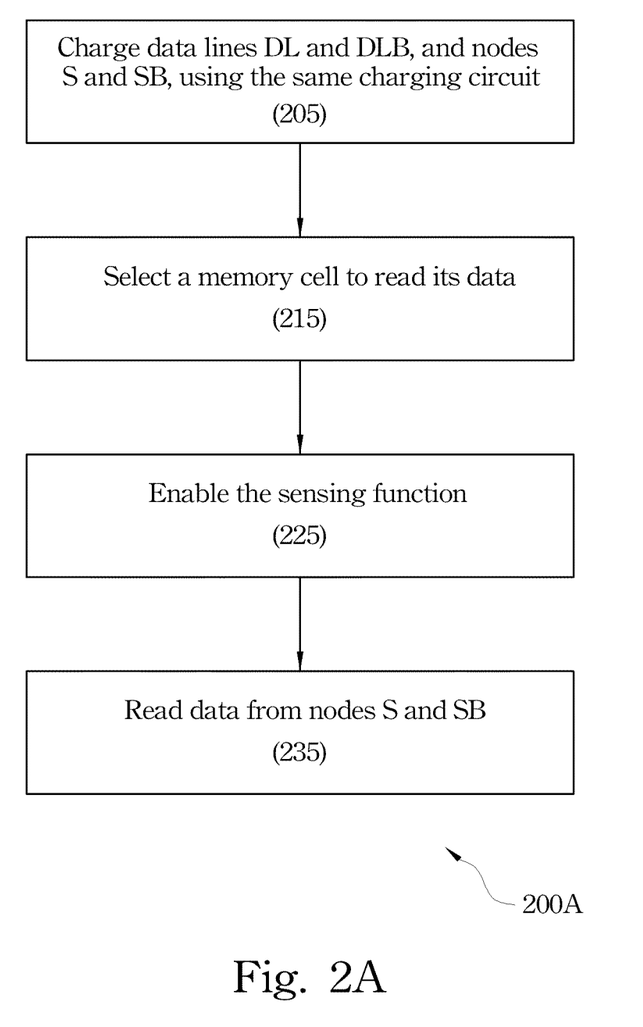
FIG. 2A shows a flowchart illustrating a method embodiment of the sense amplifier of FIG. 1A.

FIG. 2A shows a flowchart 200A illustrating a method embodiment. In this illustration SA 100A is used in conjunction with a memory array to read data from a memory cell. The memory array is commonly known in the art.

Figure 2B:
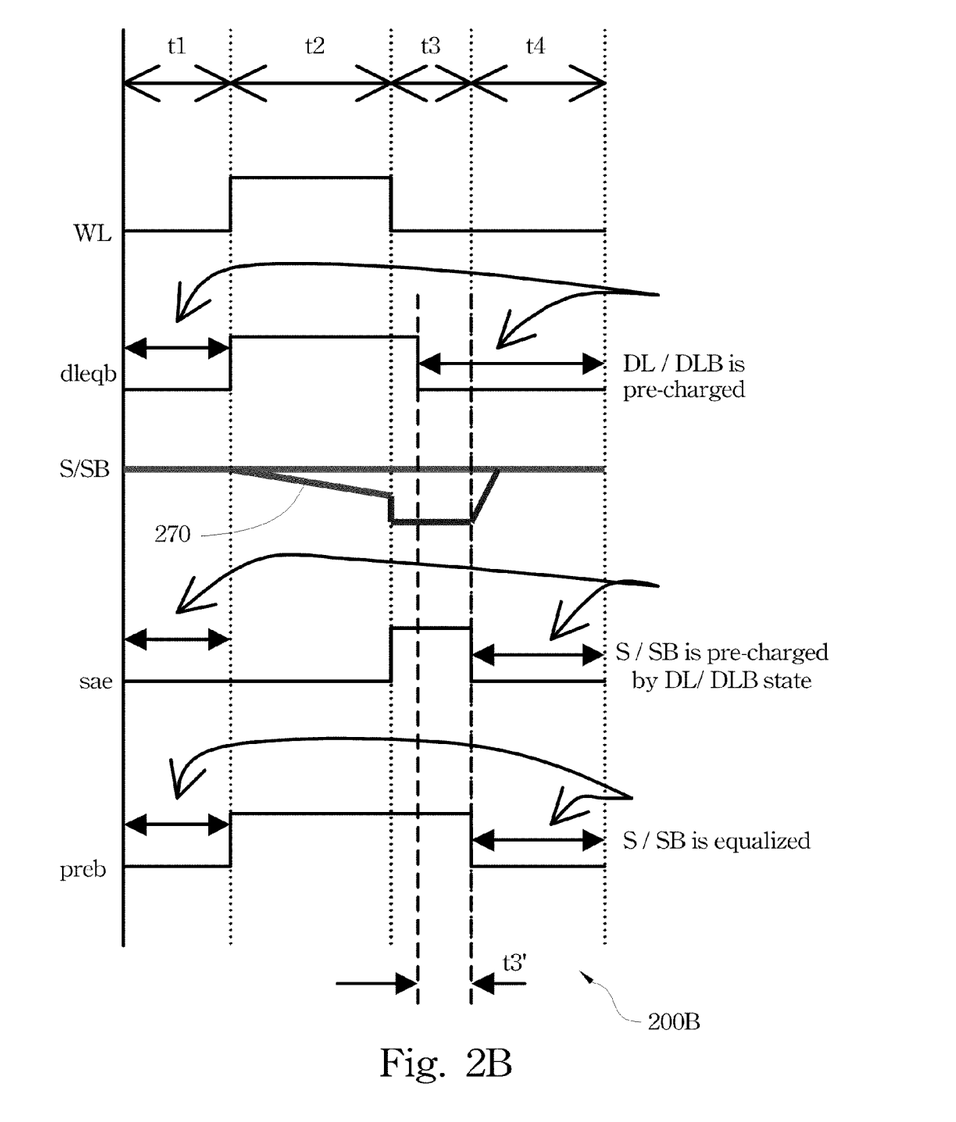
FIG. 2B shows waveforms illustrating operation of the sense amplifier in FIG. 1A, in accordance with an embodiment

In step 205, signal dleqb and signal preb are activated and signal sae is deactivated. The activated signal preb turns on transistors PC1, PC2 and PC3 and thereby charges data lines DL and DLB through voltage Vdd of transistors PC1 and PC2. The activated signal sae turns on transistors P2 and P3 and thereby transfers the charged signal on lines DL and DLB to nodes S and SB. Signal sae being deactivated also turns off transistor N4, which turns off cross latch CX, and disabling the sensing function of SA 100A. The activated signal preb turns on transistor P4 and thereby equalizes nodes S and SB. Word line, e.g., signal WL (as shown in FIG. 2B) is also deactivated so that no memory cell is selected.

In step 215 a word line, e.g., signal WL (e.g., word line WL, FIG. 2), is activated and signal dleqb is deactivated. The activated word line WL selects a memory cell from which data is to be read. As a result, the selected memory cell discharges bit-line BL or BLB (not shown), resulting in a differential signal between bit-lines BL and BLB, which is passed to lines DL and DLB, and into nodes S and SB. The deactivated signal dleqb ends the charging for lines DL and DLB.

In step 225 signal sae is activated to turn on transistor N4, providing a current path for cross latch CX and enabling the sensing function wherein SA 100A starts to discharge node S or node SB depending on which one is lower than the other one. The level at nodes S and SB eventually results in a large signal (e.g., rail to rail). The activated signal sae also turns off transistors P2 and P3, finishing discharging nodes S and SB. Signal WL is also deactivated in this step.

In step 235 the data at node S and/or node SB is read out from node rdout and/or node rdoutb.

Waveforms Illustrating Operation of an Embodiment

FIG. 2B shows waveforms 200B illustrating operation of SA 100A in conjunction with a read cycle of a memory cell in a memory array, in accordance with an embodiment of the invention. Time periods t1, t2, and t3 in FIG. 2B correspond to steps 205, 215, and 225, respectively, in FIG. 2A.

During time t1, which corresponds to step 205 in FIG. 2A, SA 100A is in an idle state, and is used to select a cell address because signal WL is deactivated (e.g., low). Because signal dleqb is activated (e.g., low), it turns on transistors PC1, PC2, and PC3, which charges lines DL and DLB to a high signal. Because signal sae is also deactivated (e.g., low), it turns on transistors P2 and P3 and charges nodes S and SB to a high signal from the high signal of lines DL and DLB. Signal sae continues to be deactivated low until the end of time t2. During this time t1, signal preb is also activated (e.g., low) to turn on transistor P4, equalizing nodes S and SB.

At the end of time t1 (e.g., starting time t2), which corresponds to step 215 in FIG. 2A, signals dleqb and preb are de-activated (e.g., high), ending the charging and equalizing period. At this time t2, signal WL is activated (e.g., high) to select a memory cell from which data is read. The data in the memory cell, depending on its logic level, discharges the bit-line BL or BLB, and the differential signal is passed into lines DL and DLB, and then nodes S and SB. This discharge is illustrated by the decreasing in level of line 270. At the end of time t2, node S or SB is completely discharged, resulting in one node being low and the other node being high, based on full rail-to-rail signals.

During time t3, which corresponds to step 225 in FIG. 2A, signal sae is activated (e.g., high), which turns on transistor N4, providing a current path for cross latch CX, and enabling the sensing function of SA 100A. At this time, node S or node SB has shown a clear high or low. Expressed alternatively, SA 100A has amplified the small signal difference between bit-lines BL and BLB, and data lines DL and DLB into the rail-to-rail large signal of a full low/high. The data at node S and/or SB is then read out in node rdout and/or rdoutb (e.g., step 235 in FIG. 2A). After selecting the memory cell for reading, at the end of time t2 (e.g., starting time t3), signal WL is deactivated (e.g., low).

During time t4 signals WL, dleqb, sae, and preb include the same logic level as in time t1, and therefore function similar to time 1 as explained above.

As illustrated in waveforms 200B, lines DL and DLB, and nodes S and SB are simultaneously pre-charged when lines DL and DLB are pre-charged and signal sae is deactivated. During time t3', even though lines DL and DLB are pre-charged, nodes S and SB are not pre-charged because signal sae is activated during this time.

Performance Advantages by Way of Comparisons

Figure 3:
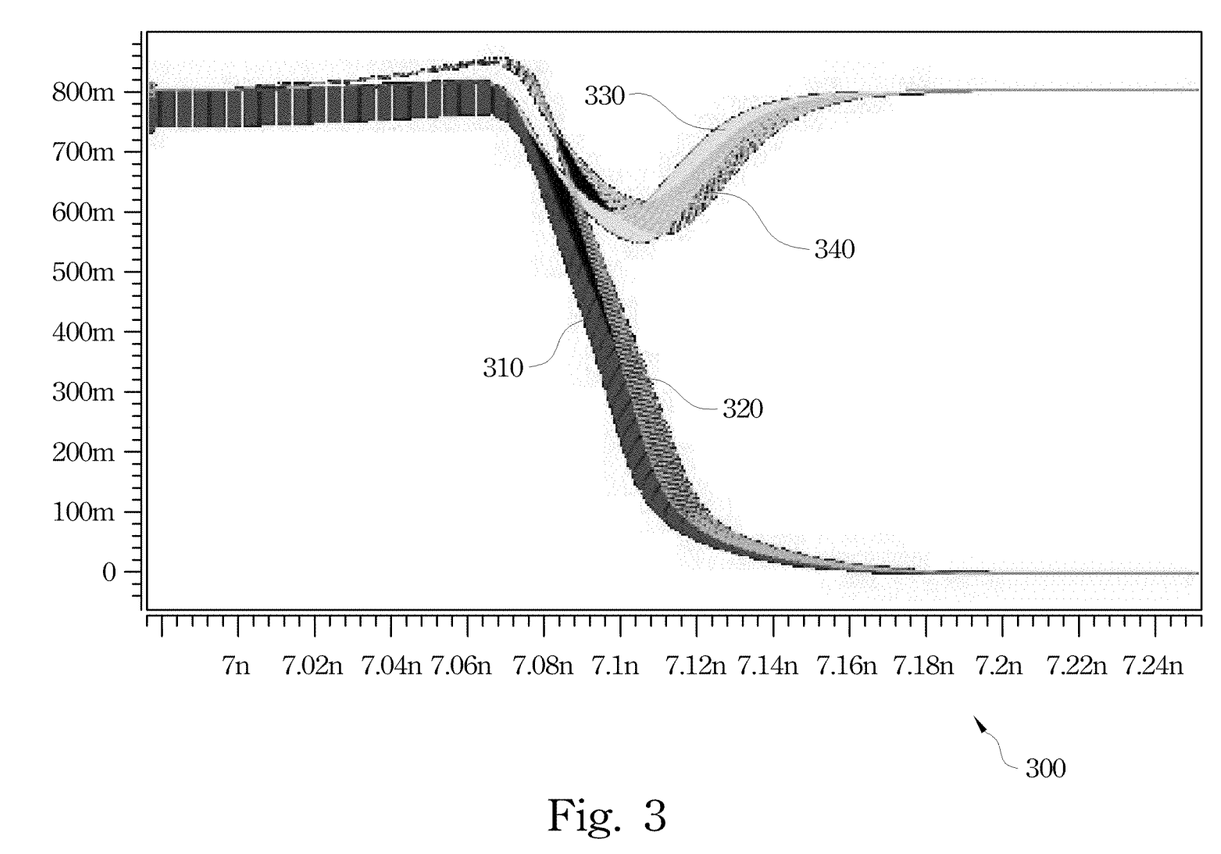
FIG. 3 shows waveforms illustrating an advantage of the sense amplifier in FIG. 1A, in terms of speed, in accordance with an embodiment.

FIG. 3 shows a graph 300 comparing an embodiment of the invention against another approach (e.g., approach APP by Dhong et al., "A 4.8 GHz Fully Pipelined Embedded SRAM in the Streaming Processor of a Cell processor", ISSCC 2005, Session 26, Static Memory, 26.7) in terms of transitioning speed (in nanoseconds) versus voltage (in millivolts). Waveforms 310 and 330 represent signals on nodes SB and S in accordance with an embodiment of the invention, while waveforms 320 and 340 represent comparable signals SB and S in accordance with approach APP. As shown, waveform 310 transitions from a high to a low faster than waveform 320. Similarly waveform 330 is pulled up faster than waveform 340. The illustrative embodiment of the invention is about 8% (eight percent) faster than approach APP.

Figure 4:
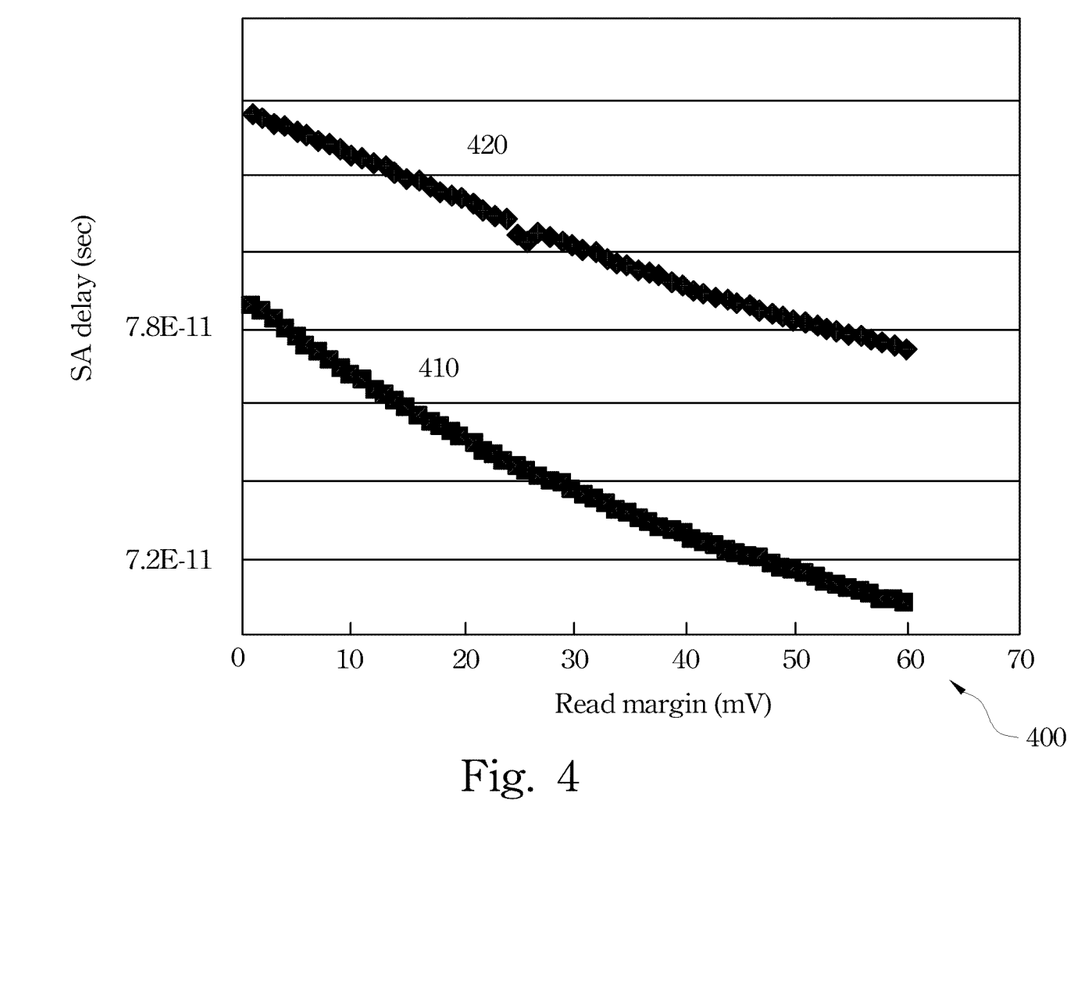
FIG. 4 shows waveforms illustrating an advantage of the sense amplifier in FIG. 1A, in terms of the read margin against sensing delay, in accordance with an embodiment.

FIG. 4 shows a graph 400 comparing an embodiment of the invention against approach APP, in terms of the read margin (in millivolts) versus a sense amplifier delay (in time unit with normalized data). The read margin is defined as the absolute value of the voltage at line DL minus the voltage at line DLB in mV. The delay is measured from signal sae to signals at node S or node SB, e.g., at 50% (fifty percent) of VDD at fall or rise time. Waveforms 410 and 420 represent the read margin versus the SA delay of an embodiment of the invention and of approach APP, respectively. As shown, performance based on line 410 is better than performance based on line 420. For example, at a read margin of about 50 mV, the SA delay in accordance with embodiment of the invention through waveform 410 is about 7.2E-11 seconds while, at the same read margin of about 50 mV, the SA delay in approach APP is more than 7.8E-11 seconds.

Figure 5:
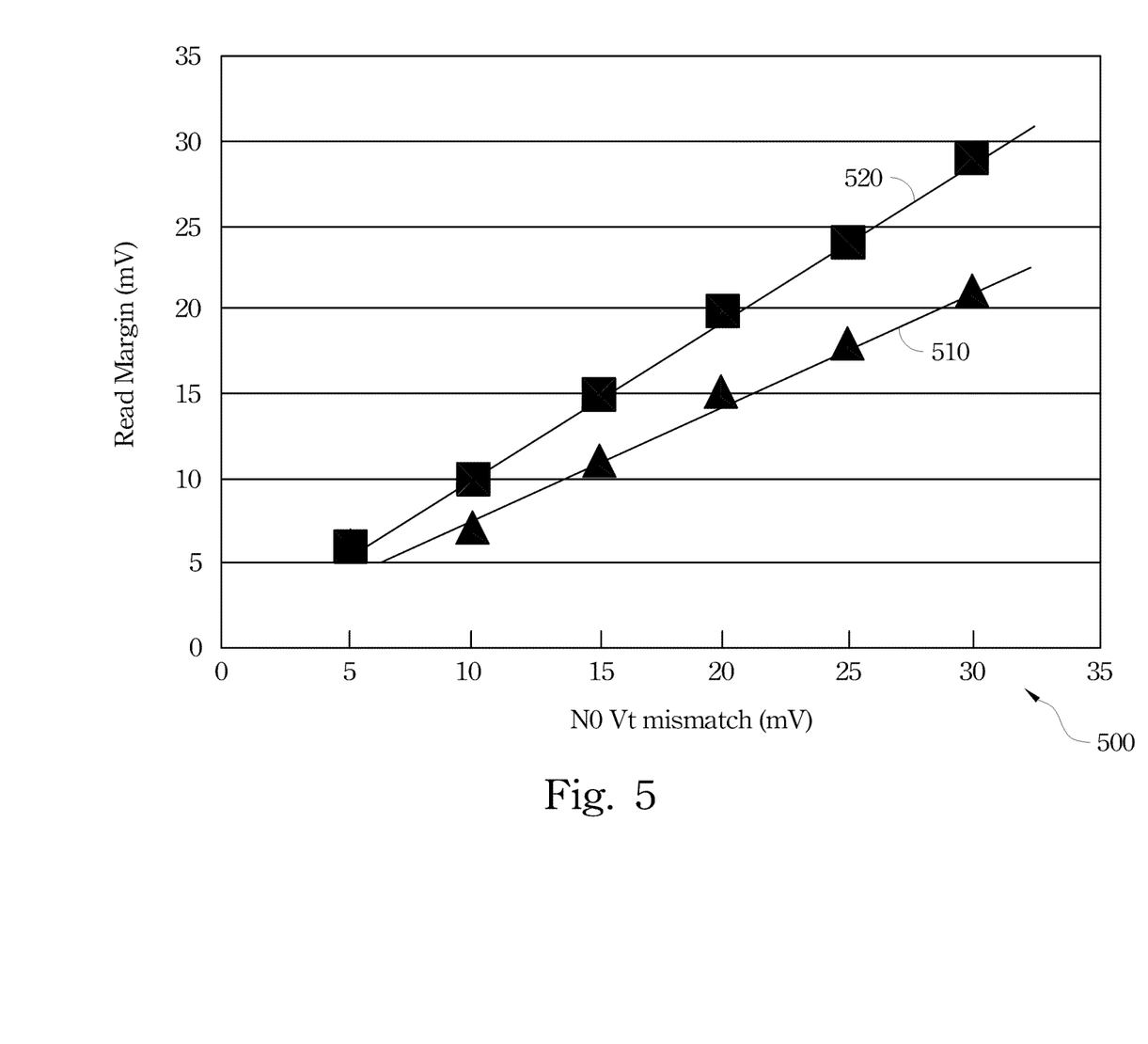
FIG. 5 shows waveforms illustrating an advantage of the sense amplifier in FIG. 1A, in terms of threshold variation against read margin, in accordance with an embodiment.

FIG. 5 shows a graph 500 comparing an embodiment of the invention against approach APP, in terms of voltage threshold variation/mismatch of transistor N0 (in millivolts) versus read margin (in millivolts). Graph 500 may be referred to as sensitivity analysis of transistor N0. Lines 510 and 520 represent the sensitivity of an embodiment of the invention and of approach APP, respectively. In FIG. 5, Vt variation is the absolute value of the difference in voltage threshold of transistor N0 (e.g., Vt_N0) and of transistor N1 (e.g., Vt_N1), e.g., ABS(Vt_N0−Vt_N1). The read margin represents the absolute value difference between the voltage level on lines DL and DLB, e.g., ABS(DL−DLB). Based on the slope of line 510 as compared to the slope of line 520, some embodiments of the invention have lower sensitivity, or the sensing margin of SA 100A has a higher tolerance with respect to the device mismatch. For example, for a variation of about 20 mV, the graphed embodiment asserts about 15 mV in read margin while approach APP asserts about 20 mV in read margin. Sensitivity analysis data for transistor N2 also shows similar advantage of the invention as compared to approach APP.

Also as compared with approach APP, the graphed embodiment of the invention shows 15% (fifteen percent) improvement in layout areas, and 8% (eight percent) power improvement, which can be attributed to not using a dedicated pre-charge circuitry for the internal nodes S and SB, but sharing the pre-charge mechanism with that of lines DL and DLB.

A number of embodiments of the invention have been described. It will nevertheless be understood that various modifications may be made without departing from the spirit and scope of the invention. For example, the various transistors being shown as a particular type (e.g., NMOS and PMOS) are for illustration purposes, embodiments of the invention are not limited to a particular type, but the dopant type selected for a particular transistor is a design choice and is within the scope of embodiments of the invention. The logic level (e.g., low or high) of the various signals used in the above description is also for illustration purposes, embodiments of the invention are not limited to a particular level when a signal is activated and/or deactivated, but, rather, selecting such a level is a matter of design choice and is within the scope of the invention.

The above method embodiments show exemplary steps, but they are not necessarily required to be performed in the order shown. Steps may be added, replaced, changed order, and/or eliminated as appropriate, in accordance with the spirit and scope of the invention.

Each claim of this document constitutes a separate embodiment, and embodiments that combine different claims and/or different embodiments are within scope of the invention and will be apparent to those skilled in the art after reviewing this disclosure. Accordingly, the scope of the invention should be determined with reference to the following claims, along with the full scope of equivalents to which such claims are entitled.

What is claimed is:

1. A sense amplifier comprising:
   a pair of data lines comprising a first data line and a second data line;
   a first pair of transistors of a predetermined type, the first pair of transistors comprising a first transistor and a second transistor, a gate terminal of the first transistor coupled with a drain terminal of the second transistor, and a gate terminal of the second transistor coupled with a drain terminal of the first transistor;
   a pair of nodes comprising a first node corresponding to the drain terminal of the first transistor and a second node corresponding to the drain terminal of the second transistor, and the pair of nodes arranged for providing read data for the sense amplifier;
   a second pair of transistors of the predetermined type, each of the second pair of transistors having a drain terminal coupled to a corresponding source terminal of the first pair of transistors and having a gate directly coupled to a corresponding one of the pair of data lines; and
   a pair of transferring devices comprising a first transferring device coupled between the first data line and the first node and a second transferring device coupled between the second data line and the second node;
   wherein in a read cycle, the first transferring device is configured to transfer data on the first data line directly to the first node; and the second transferring device is configured to transfer data on the second data line directly to the second node.

2. The sense amplifier of claim 1 further comprising:
a charge circuit configured to charge the first data line and the second data line; and
a control signal configured to control the pair of transferring devices in order to transfer a first charged signal on the first data line directly to the first node and a second charged signal on the second data line directly to the second node.

3. The sense amplifier of claim 2, wherein the control signal is further configured to control a cross latch corresponding to the first node and the second node.

4. The sense amplifier of claim 1, wherein the first transferring device and the second transferring device include one or a combination of a transistor and a pass gate.

5. A sense amplifier comprising:
a cross latch comprising a first transistor of a predetermined type, a second transistor of the predetermined type, and a first node and a second node from which data is read, the first node being at a drain terminal of the first transistor, and the second node being at a drain terminal of the second transistor;
a first transferring device having a first terminal coupled to the first node and a second terminal coupled to a first data line;
a second transferring device having a first terminal coupled to the second node and a second terminal coupled to a second data line;
a third transistor of the predetermined type having a drain terminal coupled to a source terminal of the first transistor and a gate terminal directly coupled to the second data line;
a fourth transistor of the predetermined type having a drain terminal coupled to a source terminal of the second transistor and a gate terminal directly coupled to the first data line; and
a control signal configured to control the first transferring device, the second transferring device, and the cross latch.

6. The sense amplifier of claim 5, wherein the first transferring device and the second transferring device comprise one or a combination of a transistor and a pass gate.

7. The sense amplifier of claim 5, wherein the first transferring device and the second transferring device comprise a PMOS transistor.

8. The sense amplifier of claim 5 further comprising a device from which the control signal controls the cross latch.

9. The sense amplifier of claim 5, further comprising a charge circuit coupled to the first data line and the second data line, wherein the charge circuit is configured to charge the first data line and the second data line, and the charge circuit together with the control signal, the first transferring device, and the second transferring device, is configured to charge the first node and the second node, using a first charged level on the first data line and a second charged level on the second data line.

10. A method comprising:
in a read cycle related to a sense amplifier,
turning off a cross latch corresponding to a first node and a second node of the sense amplifier, the cross latch comprising a first transistor of a predetermined type and a second transistor of the predetermined type, the first node being at a drain terminal of the first transistor, and the second node being at a drain terminal of the second transistor;
turning on a first transferring device to electrically couple a first data line to the first node;
turning on a second transferring device to electrically couple a second data line to a second node;
charging, using a charge circuit, the first data line and the second data line;
charging the first node and the second node using the charge circuit, the first transferring device and the second transferring device;
transferring a differential signal corresponding to data from a bit cell to the first data line, the second data line, and gate terminals of a third transistor and a fourth transistor of the predetermined type, the third transistor having a drain terminal coupled to a source terminal of the first transistor and a gate terminal directly coupled to the second data line, and the fourth transistor having a drain terminal coupled to a source terminal of the second transistor and a gate terminal directly coupled to the first data line; and
after one of the first and second nodes is discharged responsive to the differential signal, performing operations comprising:
turning on the cross latch;
turning off the first transferring device; and
turning off the second transferring device.

11. The method of claim 10 further using a control signal in turning off the cross latch, turning on the first transferring device, turning on the second transferring device, turning on the cross latch, turning off the first transferring device, and turning off the second transferring device.

12. The method of claim 10, wherein the first transferring device and the second transferring device include one or a combination of a transistor and a pass gate.

13. The method of claim 10, wherein the first node and the second node store data to be read for the sense amplifier.

14. The method of claim 10, further comprising supplying a supply voltage to the cross latch during an entire period of operation of the sense amplifier.

15. The sense amplifier of claim 1, wherein each of the pair of transferring devices has a same structure.

16. The sense amplifier of claim 1, wherein each of the pair of transferring devices comprises p-type metal-oxide-semiconductor (PMOS) transistors.

17. The sense amplifier of claim 1, wherein each of the pair of transferring devices comprises:
an inverter; and
a pass gate, wherein the pass gate is configured to be controlled by an output of the inverter.

18. The sense amplifier of claim 5, wherein first transferring device has a same structure as the second transferring device.

19. The sense amplifier of claim 5, wherein the first transferring device and the second transferring device comprise p-type metal-oxide-semiconductor (PMOS) transistors.

20. The sense amplifier of claim 5, wherein each of the first transferring device and the second transferring device comprises:
an inverter; and
a pass gate, wherein the pass gate is configured to be controlled by an output of the inverter.

21. The sense amplifier of claim 1, further comprising a third transistor and a fourth transistor, a gate terminal of the third transistor coupled with a drain terminal of the fourth transistor, a gate terminal of the fourth transistor coupled with a drain terminal of the third transistor, the drain terminal of the third transistor coupled with the drain terminal of the first transistor, and the drain terminal of the fourth transistor coupled with the drain terminal of the second transistor.

22. The sense amplifier of claim 5, wherein the cross latch further comprises a fifth transistor and a sixth transistor, a gate terminal of the fifth transistor coupled with a drain terminal of the sixth transistor, a gate terminal of the sixth transistor coupled with a drain terminal of the fifth transistor, the drain terminal of the fifth transistor coupled with the drain terminal of the first transistor, and the drain terminal of the sixth transistor coupled with the drain terminal of the second transistor.

* * * * *